US007144796B2

(12) United States Patent
Dietz et al.

(10) Patent No.: US 7,144,796 B2
(45) Date of Patent: Dec. 5, 2006

(54) METHOD OF FABRICATING SEMICONDUCTOR COMPONENTS THROUGH IMPLANTATION AND DIFFUSION IN A SEMICONDUCTOR SUBSTRATE

(75) Inventors: Franz Dietz, Heilbronn (DE); Volker Dudek, Brackenheim (DE); Michael Graf, Leonberg (DE)

(73) Assignee: Atmel Germany GmbH, Heilbronn (DE)

( * ) Notice: Subject to any disclaimer, the term of this patent is extended or adjusted under 35 U.S.C. 154(b) by 260 days.

(21) Appl. No.: 10/946,506

(22) Filed: Sep. 20, 2004

(65) Prior Publication Data

US 2005/0095804 A1   May 5, 2005

(30) Foreign Application Priority Data

Sep. 19, 2003   (DE) ................................ 103 45 345

(51) Int. Cl.
*H01L 21/22* (2006.01)
*H01L 21/8238* (2006.01)

(52) U.S. Cl. ........................ 438/545; 438/224; 438/228
(58) Field of Classification Search ................ 438/545, 438/223–224, 227–228, 527; 257/335
See application file for complete search history.

(56) References Cited

U.S. PATENT DOCUMENTS

| 5,341,011 | A | | 8/1994 | Hshieh et al. |
| 5,504,033 | A | | 4/1996 | Bajor et al. |
| 5,770,504 | A | * | 6/1998 | Brown et al. ................ 438/296 |
| 6,242,788 | B1 | | 6/2001 | Mizuo |
| 6,316,299 | B1 | | 11/2001 | Tung |
| 6,524,903 | B1 | | 2/2003 | Ootsuka et al. |
| 6,780,713 | B1 | | 8/2004 | Bromberger et al. |
| 2002/0113267 | A1 | | 8/2002 | Brown et al. |
| 2003/0116819 | A1 | | 6/2003 | Hokazono |
| 2003/0222329 | A1 | * | 12/2003 | Fresart et al. ................ 257/565 |
| 2004/0191996 | A1 | * | 9/2004 | Takaishi ..................... 438/270 |
| 2004/0222458 | A1 | * | 11/2004 | Hsieh et al. ................ 257/329 |
| 2005/0064678 | A1 | | 3/2005 | Dudek et al. |

FOREIGN PATENT DOCUMENTS

| DE | 69430768 | 11/2002 |
| DE | 10131705 | 1/2003 |
| JP | 63144540 | 6/1988 |
| WO | WO 03046977 | 6/2003 |

* cited by examiner

*Primary Examiner*—Thanh Nguyen
(74) *Attorney, Agent, or Firm*—W. F. Fasse; W. G. Fasse

(57) ABSTRACT

A semiconductor element such as a DMOS-transistor is fabricated in a semiconductor substrate. Wells of opposite conductivity are formed by implanting and then thermally diffusing respective well dopants into preferably spaced-apart areas in the substrate. At least one trench and active regions are formed in the substrate. The trench may be a shallow drift zone trench of a DMOS-transistor, and/or a deep isolation trench. The thermal diffusion of the well dopants includes at least one first diffusion step during a first high temperature drive before forming the trench, and at least one second diffusion step during a second high temperature drive after forming the trench. Dividing the thermal diffusion steps before and after the trench formation achieves an advantageous balance between reducing or avoiding lateral overlapping diffusion of neighboring wells and reducing or avoiding thermally induced defects along the trench boundaries.

25 Claims, 3 Drawing Sheets

METHOD OF FABRICATING SEMICONDUCTOR COMPONENTS THROUGH IMPLANTATION AND DIFFUSION IN A SEMICONDUCTOR SUBSTRATE

PRIORITY CLAIM

This application is based on and claims the priority under 35 U.S.C. §119 of German Patent Application 103 45 345.8, filed on Sep. 19, 2003, the entire disclosure of which is incorporated herein by reference.

FIELD OF THE INVENTION

The invention relates to a method for fabricating semiconductor components in a semiconductor substrate by forming wells with different conductivity types and forming trench structures in the substrate.

BACKGROUND INFORMATION

A well is a three-dimensional region or portion of a semiconductor substrate, having majority charge carriers of a different conductivity type (for example P-type) in comparison to the majority charge carriers of the surrounding portion of the substrate around the well (for example N-type). As a result, blocking or non-conductive PN-junctions will be formed along the peripheral edges or boundaries of the well, in connection with a suitable electrical reverse-biasing thereof, whereby these PN-junctions effectively electrically isolate the interior of the well from the surroundings thereof.

Various semiconductor devices include different types of trench structures in a semiconductor substrate. For example, such trenches are used for electrical isolation of so-called component boxes, pockets or tubs in the depth and/or on the surface of the semiconductor substrate. As a further example, such trenches are used for the three-dimensional formation or configuring of electrically active regions such as a trench capacitor or a transistor drift zone within the semiconductor substrate. Generally, deep trenches are used to achieve electrical isolation in the depth direction, while shallow trenches are preferred for achieving the three-dimensional formation or configuration of electrically active regions and also for electrical isolation purposes on the surface of the substrate. Deep trenches and shallow trenches are differentiated from one another by the aspect ratio of the depth relative to the width thereof. Deep trenches have an aspect ratio of greater than one and shallow trenches have an aspect ratio of less than or equal to one. In other words, deep trenches are deeper than they are wide, while shallow trenches are as wide as or wider than they are deep.

It is generally known in the art to form wells and trenches as mentioned above, as well as various active regions within a semiconductor substrate to form a semiconductor device. Examples of such active regions include individual transistors that are integrated into the same common substrate. The individual active regions are separated from one another by field areas or field regions, so that the surface of the semiconductor substrate can be divided into active regions and field regions that are complementary to each other.

A device fabrication method incorporating the above features is known, for the special case of fabricating a DMOS-transistor as a semiconductor element, from the German Laying-Open Publication DE 101 31 705 A1, as well as the counterpart U.S. Pat. No. 6,780,713 (Bromberger et al.), the entire disclosure of which is incorporated herein by reference.

The above mentioned field regions are provided with insulating or isolating structures in order to avoid an undesired drift of charge carriers, i.e. electrons or holes, between the respective active regions. In integrated circuits based on silicon technology, it is known to isolate respective active regions on the surface of the device or circuit from each other by means of an insulation structure consisting of a silicon oxide, generally called a field oxide.

On the other hand, active regions are isolated from one another in the depth of the structure of the integrated circuit by means of the deep trenches mentioned above, or alternatively or additionally by well regions or wells used for the lateral isolation. Such wells are typically produced through implantation of a dopant followed by thermally supported diffusion of the dopant into the semiconductor substrate. Since the diffusion is generally not directional, i.e. does not proceed along a preferred direction, the diffusion typically occurs both in the depth direction as well as in the width or lateral direction. Thus, the lateral spreading of the wells will become ever greater as the wells are to be diffused or driven deeper into the semiconductor substrate such as silicon, by a high temperature well drive step. In other words, as the dopant is diffused deeper into the substrate it necessarily also spreads wider in the lateral direction. As a result, the mutual influence or interference of adjacent wells or adjacent regions due to out-diffusion will also increase. In this regard, the term "out-diffusion" refers to a reduction of a net concentration of the dopants along the peripheral edge or boundary of a well due to a lateral diffusion of dopants out of an oppositely doped adjacent or neighboring well. Thus, the net dopant concentration of the intended dopant type of a given well falls off or diminishes toward the lateral boundaries thereof adjacent to a neighboring well of opposite dopant polarity.

In the fabrication method known from the above mentioned German Patent Laying-Open Publication DE 101 31 705 A1, respective well regions are defined through an implantation of dopants into areas near the surface of the substrate, followed by a complete in-diffusion, i.e. diffusion of the dopant into the substrate volume by a thermal drive-in step, before the further subsequent formation of deep trenches that will define component boxes isolated from each other within the substrate. Still further in the known method according to the German Publication mentioned above, another trench structure is formed by a Shallow Trench Isolation (STI) etching process, and then a separate doping of the boundaries (walls and floor) of the trench is carried out to form a drift zone of the DMOS-transistor.

The above mentioned conventional process of defining the wells before forming trenches can unfortunately suffer the effects of the above discussed out-diffusion, especially if high dopant concentrations and/or deep diffusion penetration depths are to be achieved. In order to avoid or prevent such undesired influences of out-diffusion along the respective boundaries of neighboring well regions of opposite conductivity type, the spacing distance between electrically active regions with different well dopings must be selected sufficiently large so that the respective dopant species do not out-diffuse and thus counteract the intended doping in the neighboring well region. However, such a large spacing distance between differently doped well regions undesirably limits the packing density of device structures per surface area. In other words, the lateral spacing of the well regions from each other to avoid the undesirable influences of out-diffusion mutually between neighboring wells requires a corresponding minimum lateral width of the total device structure, which necessarily limits the possible size-reduction or miniaturization of the device.

SUMMARY OF THE INVENTION

In view of the above, it is an object of the invention to provide a method of fabricating a semiconductor component in a semiconductor substrate while enabling a further size reduction or miniaturization of the device structure. More particularly, it is an object of the invention to provide such a semiconductor component fabrication method that avoids or reduces the undesirable out-diffusion or diffusion interference between neighboring well regions of different conductivity type. The invention further aims to avoid or overcome the disadvantages of the prior art, and to achieve additional advantages as apparent from the present specification. The attainment of these objects is, however, not a required limitation of the claimed invention.

The above objects have been achieved according to the invention in a method of fabricating a semiconductor component in a semiconductor substrate comprising steps of forming first and second wells with opposite conductivity type in the semiconductor substrate, forming at least one trench in the semiconductor substrate, as well as forming and electrically contacting active regions in the semiconductor substrate. More particularly, forming the wells comprises implanting respective dopants for the first and second wells into the semiconductor substrate, and then carrying out at least one first diffusion through a first high temperature drive step before forming the at least one trench, followed by at least one second diffusion through a second high temperature drive step after forming the at least one trench.

The inventive method divides the high temperature treatment for diffusing dopants into the wells into two separate high temperature drive steps for carrying out two separate diffusions, namely one before and one after forming the trench (es). This serves to reduce or avoid the problems of out-diffusion or interfering diffusion of opposite dopant species from neighboring oppositely-doped well regions as discussed above.

This advantage of the invention must be understood further in connection with a balancing of another and somewhat-contrary advantage, as follows. For purposes of this comparative discussion, one could consider carrying out the diffusion of the well doping entirely after the formation of trenches, in order to thereby avoid or prevent the above-mentioned problem of out-diffusion in the outer edges or boundary areas of the respective well. On the other hand, however, if the deep trenches are etched before carrying out the high temperature drive step for diffusing the dopants into the wells, this would fundamentally give rise to the problem that defects can be generated along the edge or boundary of the isolation trench due to the high thermal loading that arises during the subsequent thermal drive step for achieving the entire dopant diffusion. In the subsequent operation of the semiconductor device, such defects can lead to undesirable leakage currents, which in turn undesirably reduce the breakdown voltage of the device.

Thus, in view of the above mentioned competing or contrary considerations, the inventive method aims to provide an acceptable or even optimized compromise between a substantial reduction or avoidance of the out-diffusion of opposite dopants in the outer edges or boundary areas of neighboring wells on the one hand, and an avoidance of defects to prevent exceeding critical leakage current rates in the later operation of the fabricated device on the other hand. In this regard, the first requirement arises from the urge to achieve a further size reduction of the device structure, while the second requirement arises from the demand to achieve a high breakdown resistance. These two opposite requirements are achieved in an optimized balanced manner through the inventive division of the high temperature thermal drive steps for carrying out the diffusion of the well doping into two separate high temperature diffusion drive steps that are separated in time from one another, namely at least one such step before and at least one such step after the formation of trench structures. Thereby, the problem of out-diffusion is reduced or avoided, while still reducing the temperature loading of the structure after the formation of trenches.

In a preferred embodiment of the invention, at least one (or some) of the trench structures is a deep trench that mutually electrically isolates component boxes (also called pockets or tubs) formed within the semiconductor substrate. In this manner, the lateral diffusion of well dopants through the trench structures is limited. Thereby, small well regions with high dopant concentrations and/or dopant concentrations that penetrate deeply into a volume of the semiconductor substrate can be produced, without giving rise to an undesired lateral out-diffusion problem along the edges or lateral boundaries of the wells. More particularly, such an undesired lateral diffusion is prevented by the interposed trenches.

It is further preferred that the deep trenches extend all the way down to an insulating layer on which the semiconductor substrate is disposed. Thereby, the neighboring wells are not only separated and isolated from one another in a defined manner at the surface of the semiconductor substrate, but also deeply within the volume of the semiconductor substrate.

According to another preferred embodiment of the invention, at least one (or some) of the trench structures is a shallow trench that at least partially bounds and serves to define a drift zone of a DMOS-transistor. In comparison to a typical Metal Oxide Semiconductor (MOS) transistor, a DMOS-transistor is distinguished in that it additionally has a drift zone, i.e. a zone in which the motion of the charge carriers is caused or effected only by an electrical field prevailing between the opposite ends of this zone. This drift zone is provided between an edge of a control gate and a drain region of the transistor. The lateral size or extension of the drift zone can be reduced by forming the drift zone along the boundaries (i.e. especially the sidewalls) of a shallow trench.

A further preferred feature of the invention is that the shallow trench is formed through a Shallow Trench Isolation (STI) process. In the STI technology, a shallow trench is formed by an anisotropic etching process between active regions covered with a nitride protective layer, and then the etched trench is filled with an insulating material such as silicon dioxide or polysilicon. Using the STI technology, for example, higher packing densities can be achieved in comparison to the use of a V-trench etching with a LOCOS (LOCal Oxidation of Silicon) mask.

It is also preferred that the sidewalls and/or floor region of the respective trench are doped separately and independently. Thereby, the dopant profile of the drift zone can be optimized with respect to desired characteristics such as a high breakdown voltage, a low turn-on voltage, and a RESURF (REduced SURface Field) effect. This separate or individualized doping of different portions of the drift zone is preferably carried out through at least one implantation of a drift zone dopant before the second high temperature drive step and a diffusion of the implanted drift zone dopant during the second high temperature drive step. Thereby, a portion of the diffusion of the well doping is carried out purposely in a targeted and controlled manner in common with a diffusion of the drift zone doping. As a result, the method can omit a separate high temperature drive step for diffusing the drift zone dopant, so that the total process duration, thermal load, complexity, and cost can be reduced. In connection with the inventive division and sequencing of the diffusion steps of the well dopant, it is thereby also possible to optimally adjust the doping in the region of the drift zone of the DMOS-transistor under the shallow trench formed through the STI process.

It is also preferred according to the invention that a first well region into which a first dopant has been implanted, and a second well region into which a second dopant has been implanted, are laterally spaced from one another. Furthermore, the diffusion steps are then carried out in such a manner so that a region of intrinsic conductivity or base doping of the semiconductor substrate material (i.e. a region without the additional well doping) remains between the first and second well regions after completion of the high temperature drive steps. These features of the invention, individually or in combination with one another, reduce a compensation of the various different dopings of neighboring well regions in an inward direction, and thus contribute to the desired increase of the breakdown voltage to a level of more than 80 V.

In another preferred feature of the invention, the trenches are filled with a dielectric material, which preferably comprises an oxide of the semiconductor substrate material, a nitride of the semiconductor substrate material, a polycrystalline material of components or elements of the semiconductor substrate material, or a multi-layered system of any one or more of the above mentioned materials. These materials each have a good electrical insulating effect and readily form good joints with the material of the semiconductor substrate, being sufficiently temperature resistant, and insensitive to oscillation or vibrations and thus being durable and having a good fatigue strength.

Further advantages of the invention are evident from the remainder of the specification and the accompanying drawings. It should be understood that the features and characteristics disclosed herein cannot only be used in the respective disclosed combinations, but also can be used in other combinations or even individually while still remaining with the scope of the present invention.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
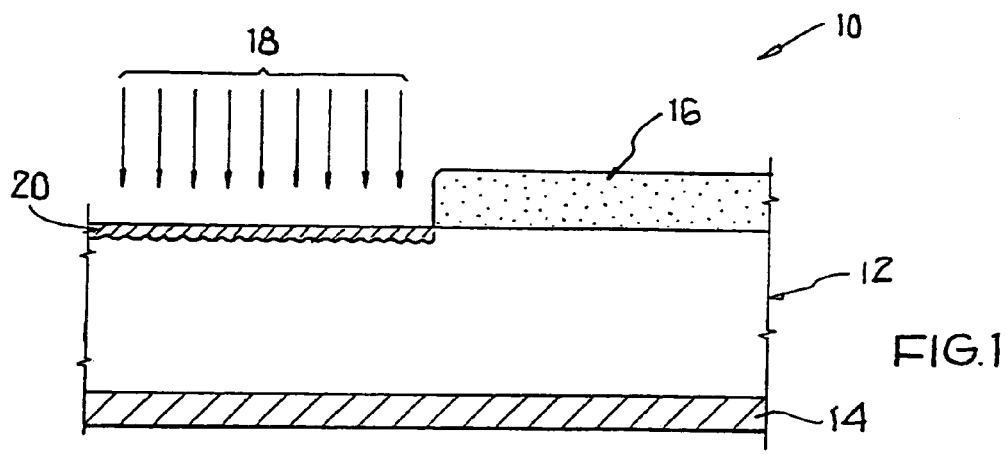
FIG. 1 is a schematic cross-section of a semiconductor substrate during a step of implanting a first dopant.

FIG. 1 schematically shows a cross-section of a portion of a semiconductor body 10 comprising a semiconductor substrate 12 on an insulating intermediate layer or isolating layer 14. A typical example of such a semiconductor body 10 is represented by a "Silicon On Insulator" (SOI) wafer. In this regard, the insulating intermediate layer 14 is typically realized as a silicon dioxide layer.

As a first step in a device or component fabrication process, respective well regions with different conductivity type will be formed in the semiconductor body 10. Namely, for forming these well regions with respective different conductivity of the respective majority charge carriers, different partial regions of the semiconductor substrate 12 will respectively be doped with dopants of different valence, so that the different conductivity types result in the respective well regions. To achieve a P-type conductivity in a four-valent semiconductor substrate material such as silicon, for example, boron atoms, which are incorporated as three-valent substitution defect sites in the silicon lattice, and which act as electron acceptors, are doped into the silicon material. Analogously, an N-type conductivity is achieved by doping, for example, a four-valent semiconductor substrate with arsenic or phosphoric atoms, which are incorporated as five-valent substitution defect sites in the basic crystal lattice formed of four-valent silicon atoms, and which act as electron donors.

For spatially defining the areas of the well regions to be formed, areas that are not be doped are covered by a mask 16. The mask 16 is patterned and/or provided with openings in any conventionally known manner. Basically in principle the dopants can be introduced into the regions of the semiconductor substrate 12 not covered by the mask 16 either by a diffusion technique or by an ion beam implantation. In modern semiconductor device fabrication processes, the ion beam implantation is generally preferred, whereby an exactly controlled quantity of dopant atoms is initially ionized uniformly and accelerated to a defined ion velocity to form an ion beam 18 of the ionized dopant atoms as indicated schematically by the arrows in FIG. 1.

The ion beam 18 of dopant ions impinges on areas of the semiconductor substrate 12 not covered by the mask 16. The dopant ions then penetrate into the crystal lattice of the semiconductor substrate material. There, the ions are retarded or decelerated until coming to a stop and respectively being received at a substitution defect site within the lattice. The penetration depth of the respective ions into the semiconductor substrate 12 depends on the kinetic energy of the ions in the ion beam 18, as well as other factors such as the composition, crystal structure, crystal orientation, and the like of the semiconductor substrate 12. Due to the release of energy from the ions as they penetrate into the semiconductor crystal lattice, the ions damage the crystal lattice structure and typically come to rest at respective interstitial lattice locations. This implantation step forms a surface layer 20 of the semiconductor substrate 12 having the dopant ions implanted and doped therein. Due to the above mentioned lattice damage of this surface layer 20 caused by the ion implantation, it is then necessary to carry out a thermal annealing, curing and activating step at an elevated temperature in order to remove or repair the defects or crystal damage, and to relocate the dopant atoms as much as possible to lattice sites in the volume of the semiconductor substrate 12. It is a significant characterizing feature of the present invention, that these thermal annealing and activating steps are preferably not all performed directly after the implantation, but rather at least some of such steps are performed only after further structuring steps have been carried out.

In FIG. 1, the relatively thin surface layer 20 represents the surface layer of the semiconductor substrate 12 that has been enriched with dopant atoms through the preceding implantation.

In that regard, the sectional hatching of the layer 20, with diagonal lines extending from the bottom left to the top right represents a particular conductivity type of the dopant, for example a P-type conductivity. Also, the relatively dense or close arrangement of the sectional hatch lines represents a relatively high dopant concentration.

Figure 2:
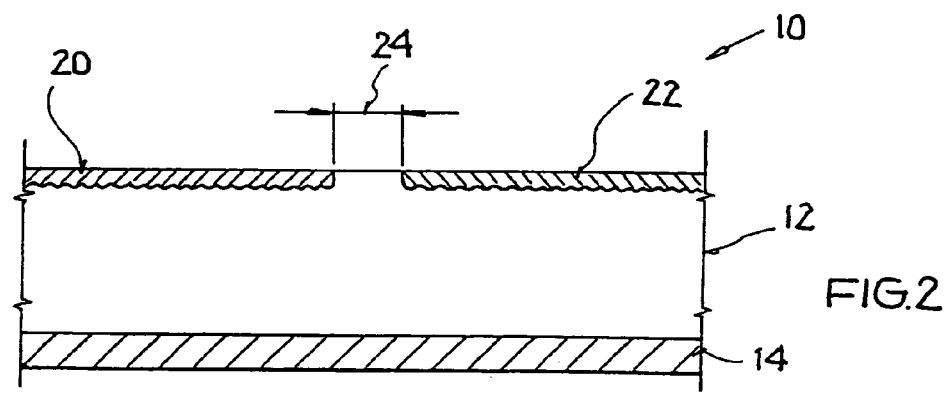
FIG. 2 is a schematic cross-section of the semiconductor substrate after the implantation of dopants as the basis for defining two wells in the substrate.

FIG. 2 shows the semiconductor body 10 of FIG. 1 after the implantation of different dopants of different polarity as the basis for defining two well regions in the semiconductor substrate 12. Namely, the first surface layer 20 with a P-type conductivity has been formed by the first ion implantation step as described above in connection with FIG. 1, and then a second oppositely (N-type) doped surface layer 22 has been additionally formed. This involves carrying out a further masking step to cover the first surface layer 20 with a further mask, and then a second ion implantation through the open or exposed area of the second mask to form the second surface layer 22 doped with implanted ions of the second conductivity type, e.g. N-type conductivity, which is represented by the diagonal sectional hatch lines extending from the upper left to the lower right in the surface layer 22 in FIG. 2.

The surface layer 22 is preferably located and formed so that an undoped or un-implanted lateral spacing distance 24 remains between the first surface layer 20 and the second surface layer 22. In this lateral spacing distance 24, the original, e.g. intrinsic, state of the semiconducting material of the semiconductor substrate 12 remains, without implanted well dopants. Alternatively, the two surface layers 20 and 22 could be directly adjoining one another, or may even overlap one another in a partial overlapping region. In this case, the donor and acceptor dopant atoms of the two surface layers would neutralize or cancel each other out in the overlapping region (to the extent that the dopant concentrations are the same).

The mask or masks 16 used for spatially limiting and defining the implantation steps as discussed above can be made of, for example, any dielectric material or materials, such as silicon oxide and silicon nitride, that are also known for use in connection with diffusion techniques. However, the ion deceleration or retardation in solid bodies, in contrast to the diffusion process, is not a thermodynamic, but rather essentially a mechanical process. Thus, essentially any material that achieves such a mechanical blocking, deceleration or retardation of the ions can be used for the ion implantation mask. Since high temperatures do not arise during the ion implantation, it is especially possible to use a photographically exposed and developed photoresist layer as the mask 16, i.e. as a protective layer to spatially limit and define the areas of ion implantation. Since no separate elevated temperature steps are needed for producing protective layers in connection with a mask 16 consisting of photoresist, as would otherwise be necessary in connection with the deposition of oxides and/or nitrides for example, the total wafer processing time and the thermal loading of the wafers are minimized.

For the above reasons, the masks 16 are preferably defined lithographically as photoresist layers. Through an etching step, the exposed or unexposed resist window areas are etched free to the surface of the semiconductor substrate 12. Then, the exposed surface of the semiconductor substrate 12 is covered with a scattering oxide, and then the doping is carried out by means of the ion implantation as described above.

As an alternative to the above described process, the semiconductor body 10 is first covered with an oxide that will later serve as an implantation mask during the implantation doping of the well regions. In that regard, the well regions are lithographically defined with masks in a photoresist layer. A wet chemical etching step opens the oxide in the resist windows, down to the silicon surface. Then, after covering the free or exposed silicon surface with a scattering oxide, the doping is carried out by means of the ion implantation.

Figure 3:
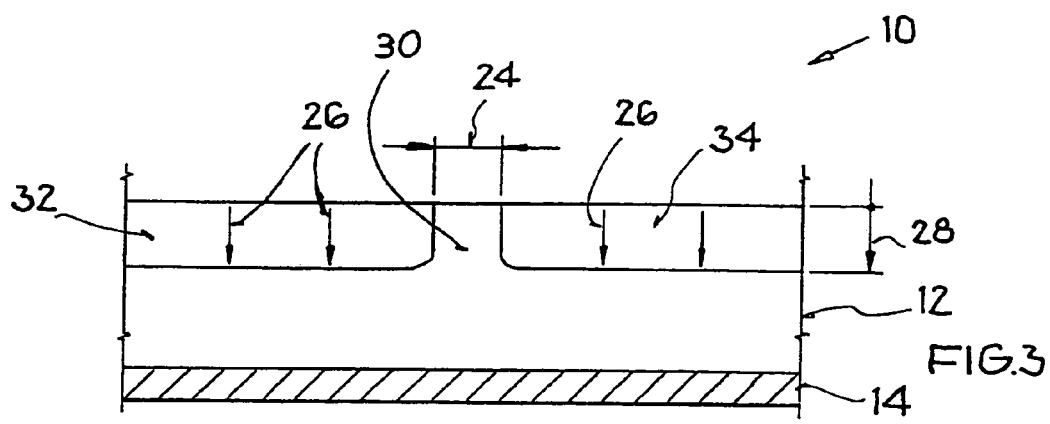
FIG. 3 is a schematic cross-section of the semiconductor substrate after a first high temperature diffusion drive step for carrying out a partial diffusion of the well dopants.

After the ion implantation, a first high temperature step is carried out to perform the partial or incomplete drive-in diffusion 26 of the dopant ions from the surface layers 20 and 22 deeper into the semiconductor substrate 12, so as to begin (partially) to form the first well 32 and the second well 34. The result of this first high temperature thermal drive step is shown in FIG. 3, wherein the first drive-in diffusion 26 has penetrated the dopant ions to a penetration depth 28 corresponding to about half (e.g. 40% to 60%) of the total depth of the semiconductor substrate 12. The arrows of the diffusion 26 in FIG. 3 represent the main diffusion direction, whereby it should be understood that a diffusion also takes place in a lateral direction. Generally, the temperature and the duration of the first high temperature thermal drive step are preferably defined or selected so that the penetration depth 28 of the dopants in this first step amounts to about one-quarter to three-quarters of the total penetration depth of the doped wells to be achieved through all of the high temperature diffusion drive steps. The particular temperature and duration to be used can be determined empirically and/or experimentally, depending on the type and other characteristics of the dopant and of the substrate material.

The lateral spacing distance 24 between the first and second surface layers 20 and 22 is preferably dimensioned so that even after the first drive-in diffusion 26, an intermediate region 30 free of the well dopants will remain between the first and second wells 32 and 34 that are being formed. If the semiconductor substrate 12 has an intrinsic P-conductivity, or has been doped with a P-type base doping, this intermediate region 30 is designated as a P-body. As mentioned above, the P-body 30 will contribute to increasing the breakdown voltage of the finished component or device. It should be understood that the conductivity types can be reversed in another example embodiment.

While the above discussion details a single first drive-in diffusion 26 carried out in a single first high temperature step, it should be understood that the invention is not limited in this regard. Namely, plural drive-in diffusions can be carried out in one or more high temperature steps before the formation of one or more trench structures. In such a case, all of the drive-in diffusions and all of the high temperature steps carried out before the formation of trenches are regarded as "first" drive-in diffusions and "first" high temperature steps. Similarly, the following discussion will detail the performance of a single second drive-in diffusion during a second high temperature step, but the inventive process may alternatively include plural "second" drive-in diffusions carried out in one or more "second" high temperature steps following the formation of trenches. Thus, the term "first" high temperature step will refer to any high temperature step before the trench formation, while the term "second" high temperature step will refer to any high temperature step carried out after the trench formation.

The process following the state of FIG. 3 will now be discussed in connection with FIG. 4. In a first example embodiment of the inventive method, the next step involves the formation of deep trenches 36 in the semiconductor substrate 12. In this context, a trench 36 is regarded as "deep" when it has a depth 38 greater than a width 40 thereof. Note that in FIG. 4, the trench width 40 represents the average width when the trench 36 has a tapering cross-section. The deep trenches 36 are formed either by a wet etching process or by a dry etching process in connection with a masking step. When an SOI wafer is used as the semiconductor body 10, the deep trenches 36 preferably reach all the way down the insulating layer 14, and define respective mutually isolated component boxes, also called pockets or tubs, that are bounded and isolated from each other by the trenches 36, and in which various active regions will later be formed in further method steps.

After the formation of the deep trenches 36 as described above, at least one second high temperature thermal drive step is carried out, in which the well dopants for doping the wells 32 and 34 are fully or completely thermally driven and diffused into the semiconductor substrate 12. This substantially complete second drive-in diffusion 44 is represented by the corresponding arrows showing the principle diffusion direction in FIG. 4. It can also be seen that the diffusion additionally progresses laterally, such that the P-body or intermediate region 30 free of the well dopants has a tapering or diminishing width, as the wells 32 and 34 are diffused and spread laterally along with the second diffusion 44 in the depth direction. Preferably, the second high temperature step and therewith the second drive-in diffusion 44 is carried out at a temperature and for a duration sufficient so that the dopants defining the wells 32 and 34 are driven into the semiconductor substrate 12 entirely to the insulating layer 14, so that the resulting wells 32 and 34 extend entirely down to the insulating layer 14. In connection with a relatively small thickness of the semiconductor substrate 12 of an SOI wafer 10, this total penetration of the wells 32 and 34 provides the advantage of suppressing parasitic capacitances.

Figure 4:
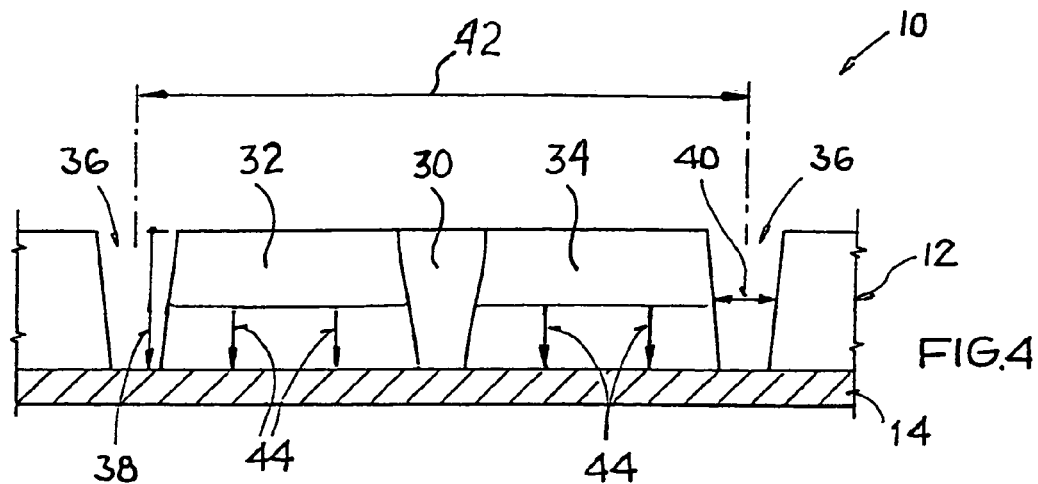
FIG. 4 is a schematic cross-section of the semiconductor substrate after performing a deep trench etch, and at the beginning of a second high temperature diffusion drive step.
Figure 5:
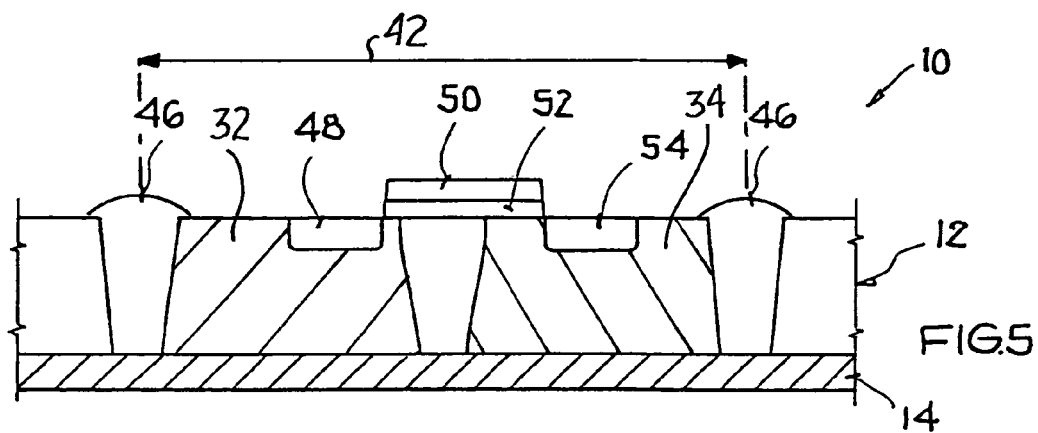
FIG. 5 is a schematic cross-section of the semiconductor substrate after completing the second high temperature diffusion drive step and further steps for forming and contacting active regions of a semiconductor component.

The result of the second high temperature step for performing the second drive-in diffusion 44 according to FIG. 4 is shown in FIG. 5. The cross-sectional hatching direction of the diagonal sectional lines in the wells 32 and 34 in FIG. 5, once again, represents the resulting conductivity type of the respective indicated region. In the example illustrated in FIG. 5, a first P-well 32 has been formed on the left, and a second N-well 34 has been formed on the right through the above first and second diffusion processes 26 and 44. In that regard, the density of the cross-sectional hatch lines is in a reversed or inverse relationship relative to the concentration of the dopant atoms in the semiconductor substrate 12. While this dopant atom concentration in the original implanted surface layers 20 and 22 was still comparatively high, the concentration of the dopants has been reduced by the distribution and diffusion-spreading of the dopants through almost the entire volume of the semiconductor substrate 12 within the respective component box 42.

The drive-in diffusion 44 in the second high temperature phase is preferably carried out at such a temperature and for such a duration, until a good uniform distribution of the dopants up to the boundaries of the trenches 36 has been established. The dopant atoms that were initially positioned at interstitial lattice positions, through the diffusion have been displaced to regular lattice positions, whereby the dopant atoms are activated. This process, as well as location or position exchange processes of the atoms of the host lattice, further achieve an annealing and repairing of lattice defects or damage of the host lattice of the semiconductor substrate 12 caused by the original ion beam impingement.

At this stage of the process, adjacently located component boxes 42 are insulated or isolated from each other at the bottom of the semiconductor substrate 12 by the insulating layer 14, and through the depth of the semiconductor substrate 12 by the deep trenches 36. In order to achieve a good isolation also at the upper surface of the semiconductor substrate 12, the trenches 36 are subsequently filled with an insulating or dielectric material 46, for example silicon dioxide, silicon nitride, polysilicon, or a multi-layer system of any one or more of these materials. The filling of the trenches 36 through oxidation can be carried out in parallel with the diffusion 44 during the second high temperature drive step for the complete drive-in diffusion of the dopant atoms into the depth of the semiconductor substrate 12.

FIG. 5 schematically represents the result of the above process steps in the semiconductor body 10 having differently doped well regions 32 and 34 separated from one another by an intermediate P-body 30 within a component box or pocket 42. Through further doping steps according to any conventionally known processes, preferably by implantation, for example, a source connection 48, a gate connection 50 on a gate oxide 52, and a drain connection 54 are produced in order to fabricate a DMOS-transistor. It should be understood that the fabrication of an actual complete DMOS transistor can include further conventionally known steps, such as a chemical mechanical polishing (CMP) planarization, an extension implantation, a threshold voltage implantation, a gate oxidation, a gate poly-deposition and structuring through a suitable mask step, further mask steps for carrying out lightly doped drain (LDD) implantations, further mask steps for source/drain implantations, a boron phosphorous silicate glass (BPSG) deposition, contact window etching steps, and metallizations.

As a summary, the above described FIGS. 1 to 5 set forth a process sequence with the following steps. Beginning with an SOI wafer as a starting material, a first implantation is carried out to implant a P-well dopant and a second implantation is carried out to implant an N-well dopant, preferably with a lateral spacing distance 24 between the two dopant implantation areas. Then, a first high temperature driving step for carrying out a first partial drive-in diffusion 26 is followed by forming a deep trench 36, which is further followed by a second complete drive-in diffusion 44 in a second high temperature driving step. This is followed by, or proceeds in parallel with, filling the trench 36 with a dielectric material 46. Finally, active regions are formed in the wells 32 and 34 to produce a transistor.

Further alternative or optional embodiment features of the invention will now be discussed in the following with reference to FIGS. 6 and 7 as well as FIGS. 8 and 9. These optional features relate to the fabrication of a DMOS-transistor as a semiconductor component, having a drift zone formed along the boundary of a trench without individual doping (FIGS. 6 and 7) or with individual doping (FIGS. 8 and 9) of the drift zone.

Figure 6:
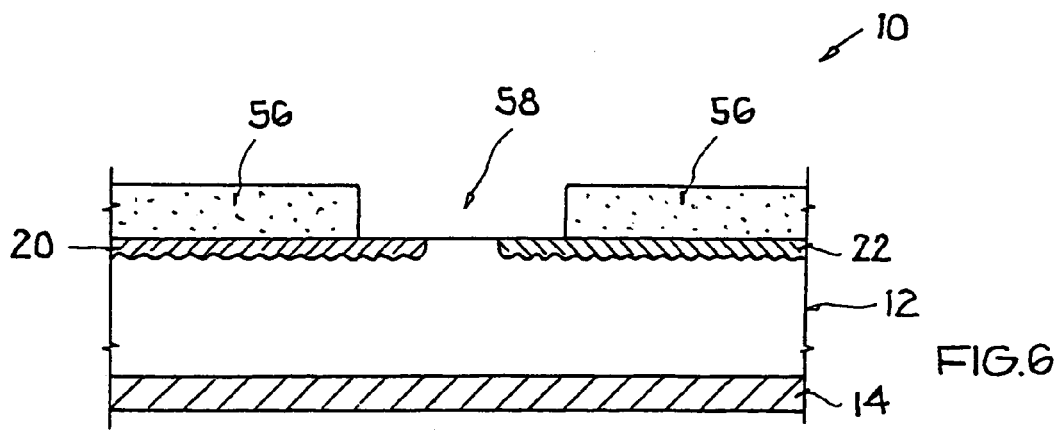
FIG. 6 is a schematic cross-section of a semiconductor substrate generally similar to FIGS. 1 and 2, but showing a first optional intermediate step for fabricating a DMOS-transistor with a drift zone to be defined and bounded along a shallow trench.
Figure 7:
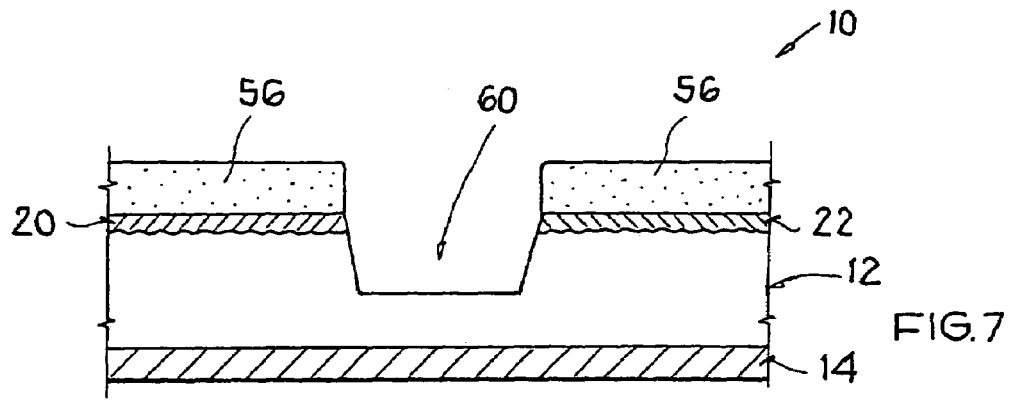
FIG. 7 is a schematic cross-section of the semiconductor substrate according to FIG. 6, showing a further associated second intermediate step of forming the shallow trench.

The embodiment according to FIGS. 6 and 7 generally begins from the first and second steps described above with reference to FIGS. 1 and 2. The details will not be repeated here. After the implantation of the dopant into the surface layers 20 and 22 according to FIG. 2, an additional mask 56 is provided on the surface of the semiconductor substrate 12 as shown in FIG. 6. This mask 56 can be either a resist mask or a hard mask, for example a mask of silicon nitride. Next, the mask 56 is opened to provide an opening 58 over the optionally present well-dopant-free intermediate region 30 between the surface layers 20 and 22, and a (preferably shallow) trench 60 is formed through the opening 58, for example by an anisotropic STI etching process, as shown in FIG. 7. According to the STI (Shallow Trench Isolation) technique, after the shallow trench 60 is formed by an anisotropic etching process between the regions or areas covered by the mask 56, the trench 60 is then later filled with an insulating material such as silicon dioxide or polysilicon.

In that context, a trench is regarded as a shallow trench if it has an aspect ratio (i.e. a ratio of the trench depth to the trench width) that is less than or equal to one and preferably less than one. Among other things, the trench 60 provides a defined spatial distance or spacing between the first doped surface layer 20 and the second doped surface layer 22.

Furthermore, the etching removal of the material to form the trench 60 will also remove any imprecise dopant areas or fringes resulting from an undesired overlapping of the surface layers 20 and 22. The finished trench 60 is shown in FIG. 7.

Next, following the stage of FIG. 7, further steps will be carried out as have been described above in connection with FIG. 3 to 5. Without repeating the details, generally that means that there will be provided, a first high temperature step for a first partial drive-in diffusion, a step of forming deep trenches isolating boundaries of individual component boxes or pockets, a second high temperature step for performing a second drive-in diffusion, and steps for forming and contacting active device regions. In that regard, the first high temperature step for the first partial drive-in diffusion can be carried out either after or before the formation of the shallow trench 60. Since at least one high temperature step is carried out after the STI etching, any defects arising during the etching can be cured or annealed-out to a certain extent. This would not be the case, however, if the drive-in diffusion of the well doping would be carried out in only a single high temperature step after the formation of the deep trenches, because a single high temperature phase of suitable duration to achieve all of the diffusion in one step can give rise to new defects.

Through this embodiment of FIGS. 6 and 7 further in combination with the steps and features of FIGS. 1 to 5, the result is a DMOS-transistor having a shallow trench 60 defining a drift zone without a separate individual doping thereof. Such a DMOS-transistor structure especially serves to increase the breakdown voltage of the transistor in a desired manner.

As a further alternative embodiment, a method for fabricating a DMOS-transistor with a separately or individually doped drift zone can be further improved according to the invention. For the fabrication of such a transistor, first the process steps described above in connection with FIGS. 1, 2 and 6 will be carried out. Next, through the opening 58 of the mask 56, one or more dopants are implanted to produce a doped region or dopant profile as schematically illustrated by the region 62 in FIG. 8. Thereby, the dopant implantation can be carried out vertically from above, or at a non-perpendicular tilt angle in order to define a preferred dopant implantation direction of the implantation. In FIG. 8, the arrows representing the dopant implantation 64, i.e. the ion beam 64 of the dopant ions, schematically indicate the implantation at a non-perpendicular tilt angle. Thereby, for example, a higher doping concentration can be achieved on the right side of the trench, i.e. at the right side of the doping profile region 62. With a later arrangement of a drain region on this right side of the component, this will, for example, result in a higher doping concentration of the drift zone near the drain region.

Figure 8:
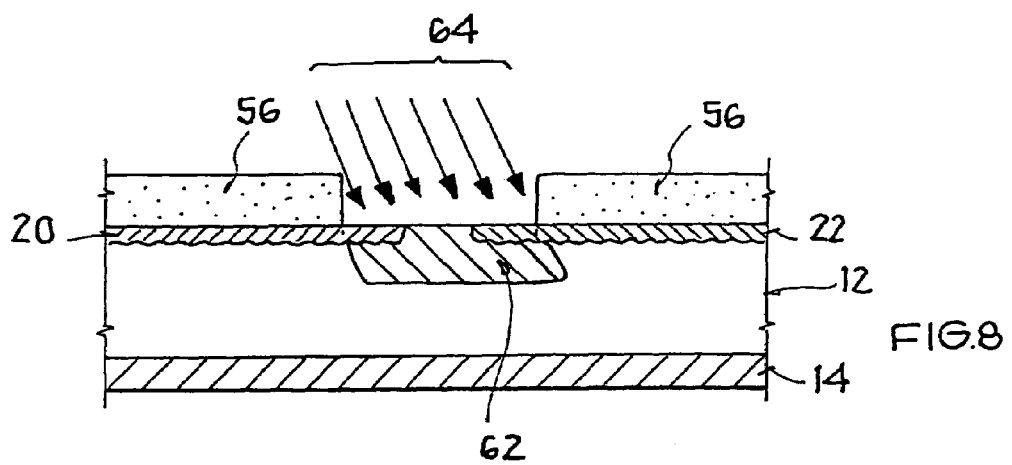
FIG. 8 is a schematic cross-section of a semiconductor substrate according to FIG. 2 showing a further optional intermediate step for producing a doped drift zone of a DMOS-transistor.
Figure 9:
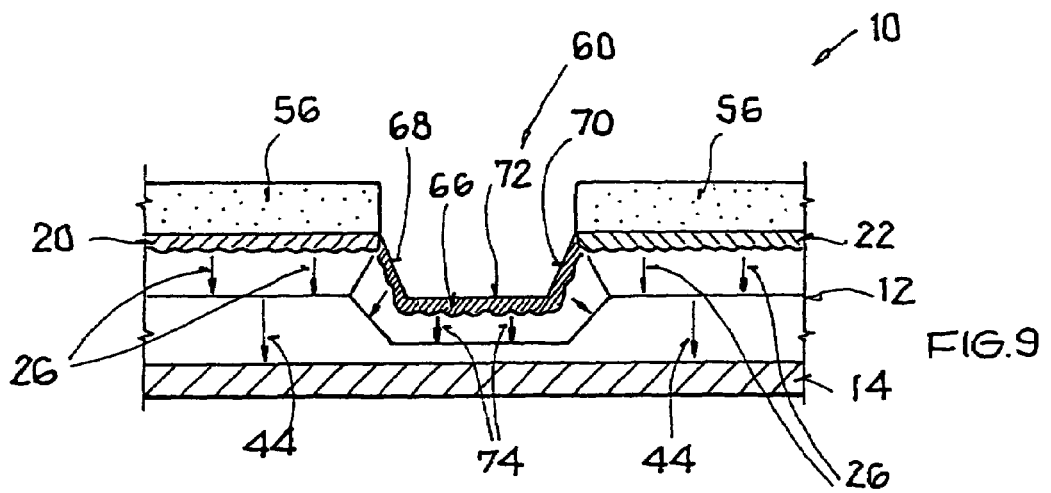
FIG. 9 is a schematic cross-section showing the semiconductor substrate of FIG. 8 after the completion of further associated steps for forming the DMOS-transistor.

Next, following the state shown in FIG. 8, an STI process is carried out to form a shallow trench 60 in the doped region or profile 62. In this regard, the etching of the STI process is carried out so that a rim or boundary region 66 of the doping profile 62 remains along the sidewalls 68 and 70 and/or along the floor 72 of the trench 60. Thereafter, the above described second high temperature driving step is carried out for achieving the complete second drive-in diffusion 44 of the well doping. In parallel or simultaneously during this second high temperature driving step, a drive-in diffusion 74 of the dopants of the remaining rim or boundary 66 of the trench 60 into the surrounding volume of the semiconductor substrate 12 is also taking place. As mentioned above, the first thermal drive-in diffusion 26 of the implanted dopants of the surface layers 20 and 22 had been performed before carrying out the STI etching of the trench 60.

In comparison to known methods for the fabrication of a DMOS-transistor without a separately doped drift zone, the present inventive method achieves advantages by dividing the diffusion steps and the associated high temperature steps into respective steps carried out before and steps carried out after the trench formation. This allows the doping profile in the drift zone to be optimally adjusted and configured, for example, in order to optimize the RESURF effect.

The inventive method can also be used for producing wells in so-called bulk substrates. In such a case, in which the wells do not extend all the way down to an insulating layer, the trenches are preferably etched to a depth greater than the depth of the wells.

The risk of the later formation of defect sites along the edges or boundaries of the trenches in subsequent high temperature steps can be reduced through the formation of a thin oxide layer as a liner oxide on the boundary surfaces of the trenches before carrying out the final high temperature step.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of producing a semiconductor component in a semiconductor substrate, comprising steps:
   a) forming a first well region having a first conductivity type and forming a second well region having a second conductivity type opposite said first conductivity type respectively in said semiconductor substrate;
   b) forming at least one trench in said semiconductor substrate; and
   c) forming and electrically contacting active regions in said semiconductor substrate;
wherein said forming of said first and second well regions in said step a) comprises steps:
   a1) implanting a first well dopant into a first portion of said first well region and implanting a second well dopant into a second portion of said second well region;
   a2) diffusing said first well dopant from said first portion partially farther into said first well region and diffusing said second well dopant from said second portion partially farther into said second well region by at least one first drive-in diffusion in a first high temperature drive step carried out before said forming of said at least one trench in said step b); and
   a3) diffusing said first well dopant farther into said first well region and diffusing said second well dopant farther into said second well region by at least one second drive-in diffusion in a second high temperature drive step carried out after said forming of said at least one trench in said step b).

2. The method according to claim 1, further comprising carrying out said implanting of said first well dopant and said implanting of said second well dopant so that said first portion of said first well region and said second portion of said second well region are spaced apart from one another by a lateral spacing distance therebetween.

3. The method according to claim 2, further comprising selecting said lateral spacing distance and selecting a temperature and a duration of said first high temperature drive step and said second high temperature drive step so that a region free of said first and second well dopants implanted in said step a1) remains laterally between said first and second well regions in said semiconductor substrate after completion of said steps a2) and a3).

4. The method according to claim 1, wherein said step a3) diffuses said first well dopant entirely to a first well depth of and throughout a first well volume of said first well region and diffuses said second well dopant entirely to a second well depth of and throughout a second well volume of said second well region.

5. The method according to claim 4, wherein said step a2) diffuses said first well dopant to a first penetration depth in a range from 25% to 75% of said first well depth in said first well region and diffuses said second well dopant to a second penetration depth in a range from 25% to 75% of said second well depth in said second well region.

6. The method according to claim 5, wherein said first penetration depth is in a range from 40% to 60% of said first well depth and said second penetration depth is in a range from 40% to 60% of said second well depth.

7. The method according to claim 4, wherein said semiconductor substrate is disposed on an insulating layer, and said first and second well depths correspond to a total thickness of said semiconductor substrate so that said first and second well regions extend through said total thickness of said semiconductor substrate to said insulating layer.

8. The method according to claim 7, wherein said forming of said at least one trench includes forming a deep trench extending through said total thickness of said semiconductor substrate to said insulating layer.

9. The method according to claim 1, wherein said forming of said at least one trench includes forming a deep trench extending deeper than said first and second well regions into said semiconductor substrate.

10. The method according to claim 1, wherein said forming of said at least one trench includes forming a trench at a location that is not between said first and second well regions of said semiconductor component.

11. The method according to claim 1, wherein said forming of said at least one trench includes forming deep trenches laterally surrounding in said semiconductor substrate an isolated component box in which said first and second well regions and said active regions have been and/or will be formed.

12. The method according to claim 11, wherein said semiconductor substrate is disposed on an insulating layer, and wherein said deep trenches are formed to extend entirely through a thickness of said semiconductor substrate to said insulating layer.

13. The method according to claim 1, wherein said forming of said at least one trench includes forming a trench at a location between said first and second well regions.

14. The method according to claim 1, wherein said semiconductor component is a DMOS-transistor, wherein said forming of said at least one trench includes forming a shallow trench, and further comprising defining a drift zone of said DMOS-transistor along boundaries of said shallow trench.

15. The method according to claim 14, wherein said forming of said shallow trench comprises carrying out an STI process to produce said shallow trench.

16. The method according to claim 14, wherein said boundaries of said shallow trench include sidewalls and a floor, and wherein said defining of said drift zone comprises an additional process of separately doping said drift zone along said sidewalls and/or said floor of said shallow trench with at least one drift zone dopant.

17. The method according to claim 16, wherein said additional process of separately doping said sidewalls and/or said floor comprises implanting said at least one drift zone dopant into said sidewalls and/or said floor before said step a3) and then diffusing said at least one drift zone dopant into said drift zone along said sidewalls and/or said floor during said second high temperature drive step in said step a3).

18. The method according to claim 1, further comprising an additional step of forming in said semiconductor substrate a shallow trench distinct from said at least one trench before said step a2) and before said step b), and wherein said forming of said at least one trench in said step b) comprises forming a deep trench between said steps a2) and a3).

19. The method according to claim 18, further comprising implanting a drift zone dopant into at least one sidewall and/or a floor of said shallow trench before said step a3) and diffusing said drift zone dopant during said second high temperature drive step in said step a3).

20. The method according to claim 18, further comprising implanting a drift zone dopant into a drift zone location in said semiconductor substrate before said forming of said shallow trench, wherein said forming of said shallow trench is carried out to retain some of said drift zone dopant along at least one sidewall and/or a floor of said shallow trench, and further comprising diffusing said drift zone dopant during at least said second high temperature drive step in said step a3).

21. The method according to claim 1, wherein said forming of said at least one trench in said step b) comprises forming a shallow trench and a deep trench between said steps a2) and a3).

22. The method according to claim 21, further comprising implanting a drift zone dopant into a drift zone location in said semiconductor substrate before said forming of said shallow trench, wherein said forming of said shallow trench is carried out to retain some of said drift zone dopant along at least one sidewall and/or a floor of said shallow trench, and further comprising diffusing said drift zone dopant during at least said second high temperature drive step in said step a3).

23. The method according to claim 1, further comprising filling said at least one trench with a dielectric material.

24. The method according to claim 23, wherein said semiconductor substrate comprises a semiconducting material, and further comprising selecting said dielectric material from a group consisting of an oxide of said semiconducting material, a nitride of said semiconducting material, a polycrystalline material comprising at least one compositional component of said semiconducting material, and a multilayer system comprising one or more of said oxide, said nitride and said polycrystalline material.

25. The method according to claim 1, further comprising coating a boundary surface of said at least one trench with a liner oxide after said step b) and before said step a3).

* * * * *